United States Patent [19]

Ammon et al.

[11] 4,418,475

[45] Dec. 6, 1983

[54] METHOD OF MANUFACTURING A PRINTED CIRCUIT CARD EDGE CONNECTOR HAVING A PULL THROUGH BELLOWS CONTACT A LAY-OVER INSULATOR

[75] Inventors: J. Preston Ammon; Harry R. Weaver, both of Dallas, Tex.; Richard O. Norman, Oxnard, Calif.

[73] Assignee: Elfab Corporation, Dallas, Tex.

[21] Appl. No.: 366,654

[22] Filed: Apr. 8, 1982

Related U.S. Application Data

[62] Division of Ser. No. 95,226, Nov. 19, 1979, Pat. No. 4,324,451.

[51] Int. Cl.[3] .............................................. H05K 3/00

[52] U.S. Cl. ........................................ 29/842; 29/884

[58] Field of Search ................. 29/739, 747, 842, 844, 29/845, 882, 884; 339/17 C, 17 LC, 17 CF, 17 L, 217 S, 176 MP, 217 R, 221 M, 192 R

[56] References Cited

U.S. PATENT DOCUMENTS

| | | | |
|---|---|---|---|
| 3,530,422 | 9/1970 | Goodman | 339/176 MP |
| 3,609,640 | 9/1971 | Longenecker | 339/217 S X |
| 3,631,381 | 12/1971 | Pittman | 339/176 MP |
| 3,800,416 | 4/1974 | Shultz, Jr. et al. | 29/843 |
| 3,808,589 | 4/1974 | Bonhomme | 339/176 MP X |
| 3,865,462 | 2/1975 | Cobaugh et al. | 339/217 S X |
| 4,045,868 | 9/1977 | Ammon et al. | 29/845 |
| 4,184,735 | 1/1980 | Ammon et al. | 339/217 S |

*Primary Examiner*—Howard N. Goldberg
*Assistant Examiner*—Carl J. Arbes
*Attorney, Agent, or Firm*—John E. Vandigriff

[57] ABSTRACT

Disclosed is a method for manufacturing a printed circuit card edge connector having a pull through bellows contact and a lay-over insulator. Manufacturing steps include inserting contacts interconnected by a common support strip into the top openings of sleeves and positioning the projections of those contacts within alignment troughs such that the contact tails extend out of the bottom of the openings in alignment. The common support strip is removed and the tails of the contacts are inserted through apertures arranged in linear arrays through the substrate. Force is applied to the tails rigidly press-fit mounting the contacts to the substrate. Further disclosed are the forming of first and second extending ears as integral portions of the upper contactor and intermediate mounting regions of the contact, respectively, and the forming of alignment tracks configured to receive the first and second ears. Also disclosed are methods of manufacture including the use of inner and outer alignment tracks wherein the first ears are inserted into the outer alignment track and, where the outer alignment track extends through the sleeve from the top to the bottom of the insulative block, applying force to the tails of the contacts and passing the first ears along the outer alignment track. Further disclosure includes receiving the ears in interference engagement within the alignment track and sliding subprojections in interference engagement with the troughs, retaining the contacts within the insulative block in alignment and slideably positioning the upper contactor region relative to the sleeves and slideably receiving the ears of said contacts in said troughs.

9 Claims, 10 Drawing Figures

METHOD OF MANUFACTURING A PRINTED CIRCUIT CARD EDGE CONNECTOR HAVING A PULL THROUGH BELLOWS CONTACT A LAY-OVER INSULATOR

This is a division of application Ser. No. 095,226, filed Nov. 19, 1979, which issued a U.S. Pat. No. 4,324,451 issued on Apr. 13, 1982.

BACKGROUND OF THE INVENTION

The invention relates to an electrical connector and, more particularly, a card edge electrical connector having pull-through, press-fit bellows type contacts in an insulator removable from around the contacts following rigid mounting of the contacts to a mounting substrate.

Historically, prior art electrical connectors have been assembled by very tightly press fitting or molding contacts into receiving blocks of insulative material which form structural members to support the contacts and hold them rigidly within the insulative body. The prior art connector having contacts rigidly fixed within the insulator, are then mounted by bolting the insulator to a pair of spaced parallel rails, or by dropping the contact tails into holes in a mounting substrate and soldering them in place. Problems have arisen in substrate mounted connectors of this type in that generally the insulator forms the structural member which supports the contacts and the insulator cannot be removed after the connector is mounted to the substrate. Further, it is virtually impossible to remove individual ones of such prior art contacts from within the insulator and/or the mounting substrate in the event one of the contacts is damaged.

The prior art techniques for assembly of the aforesaid connectors are also relatively slow because of the time required to rigidly mount each individual contact into its receiving sleeve within the insulator. Certain prior art connectors have overcome this problem by providing for simultaneous insertion of rows of contacts held together on strips into receiving sleeves which hold them in position within the insulator. Simultaneous contact insertion greatly speeds the connector assembly process and the generally light insulator/contact holding force typical of such assemblies enables insertion of the contacts into the insulator by hand, eliminating the need for mechanical pressing apparatus. Such contact-insulator assemblies are oftentimes typical of the connectors which are press fitted into contact receiving apertures in a mounting substrate. Such a connector is set forth and described in U.S. Pat. No. 4,220,393 entitled "Electrical Connector and Method of Fabrication and Assembly" and assigned to the assignee of the present invention Likewise issued U.S. Pat. No. 4,045,868 issued Sept. 6, 1977 and assigned to the assignee of the present invention and entitled "Method of Fabrication and Assembly of Electrical Connector," sets forth and describes one method of providing a press fit electrical connector in the manner set forth above.

A trend in the development of the substrate mounted connector art is that of using structures which permit the removal of the insulator from mounted contacts. Certain prior art discrete connectors have included insulators adapted for tightly holding top loaded contacts in sleeves formed therein and, in certain instances, have been used as the seating tool for press fitting the contacts in this configuration. Such an approach is illustrated in U.S. Pat. No.3,530,422, to David S. Goodman, entitled "Connector and Method for Attaching Same to Printed Circuit Board." The connector described in the Goodman Patent, includes contacts having transverse shoulder portions which are top loaded down into slots in the insulator. The contact tails are pulled through to seat the contacts, and the lower shoulder portion of each contact is twisted 90 degrees to lock each contact into the insulator bottom with the relatively large outwardly extending shoulder of the contact. The contacts can then be press fitted into apertures in a substrate by applying a force to the top of the insulators. Once the contacts have been press fitted, it is impossible to remove the insulator to expose individual ones of the contacts for repair. Similarly, each of the contacts are locked into the insulator to permit its individual removal therefrom.

In many prior art discrete connector assembly operations, the contacts are loaded into the insulator with requisite force for preliminarily securing the contacts therein and then a pulling force is applied to the bottom tail of the contacts relative to the insulator to seat the contacts securely therein. Such "pull-home" forces are generally substantially equivalent to the "push-out" force of the contact in the insulator and require additional tooling to effect the pull-home operation. Most pull-home fixtures are adapted for engaging and pulling contacts one at a time rather than in a series. Such an operation is both time consuming and imparts higher cost to the assembly. It may also be observed that when the connector of certain of these discrete assemblies is mounted upon a printed circuit board, the contact may be designed to be removed for purposes of repair. In such connectors, the contact push out force thereof is generally equivalent to the push-in force due to the type of mating configuration. However, the push-in force is optimally as low as possible to eliminate deformation of any of the components during assembly, and, therefore, the push-out force is also relatively low.

A connector and method of manufacture has been disclosed for the improved assembly and housing of contacts into an insulator to comprise a discrete connector. Such a connector and method of manufacture is shown and described in U.S. Pat. No. 4,184,735 assigned to the assignee of the present invention. The invention disclosed therein overcomes the disadvantages of the prior art by providing an insulative housing, which permits simultaneous loading of removable contacts from the top with relatively small push-in forces sufficient to seat the contacts therein, and yet lock the contacts into the seated configuration to establish high push-out forces. However, in that embodiment the insulative housing itself is not removable from around the contacts secured to a mounting substrate. The various considerations of "press fitting" are also not addressed in the aforesaid disclosure, which illustrates a bowed contact mating portion.

During the past decade, the "press fit revolution" has caused the electrical connector industry to re-evaluate many of the basic concepts which resulted in the requirement that all contacts be firmly soldered in position. The press fit concept involves the forced insertion of a contact bullet region down into a plated through hole in a circuit board slightly smaller than the bullet so that the contact is held in snug, rigid engagement with the walls of the hole. The hole walls are generally formed by plating through the drilled or punched board aperture with copper and then coating the copper with a layer of tin/lead solder material. The size of the contact and the size of the hole are configured relative to one another so that the interference between the contact and the walls of the hole provide a totally reliable electrical and mechanical engagement therebetween. The school of press fit has further subdivided itself into the advocates of the solid cross section press fit region and those who urge the advantages of a compliant region. A solid contact bullet region press fitted into a plated hole moves the side walls thereof while a compliant bullet inserted into the hole theoretically elastically yields and thereby reduces the potential damage to the insides of the holes from force fit insertion. The contacts and method of the present invention are directed principally toward the fabrication of a reliable load bearing press fit shoulder above a press fit region on the contact. The paramount reason includes the initial dimensional parameter of the square wire material stock, because only a limited number of transverse dimensional variations can be imparted to wire stock by cutting or grinding. The concept of coining a square wire fabricated contact to generate a press fit region affords certain advantages over the above described methods and is disclosed in U.S. patent application Ser. No. 174,889 filed Aug. 4, 1980, now abandoned. One aspect of said application is the provision of a method of forming press fit regions on contacts of all configurations for permitting press fit engagement by "pull home" forces. The methods and apparatus thus set forth facilitate the modification and assembly of a wide variety of contacts and connectors into press fit interconnection systems having optimized push-in/push-out features adapted for single or multi-layer boards. The transversely offset, coined region is formed in the conventional tail portion of the contact in such a manner so as to provide an optimum "press-fit" engagement within the tensile strength of the particular material under pull fit loading.

Many other advantages are obtained in a discrete insulator-contact subassembly which provides for press fitting of the contacts. Certain prior art electrical connectors have been assembled by inserting press fit contacts into the sleeves of an insulative housing and having them initially held in position by frictional interference with the side walls of the sleeves and subsequently press fitted into apertures in a mounting substrate by applying axial forces to the upper tips of the contacts. Such a connector and method of manufacture is shown respectively in U.S. Pat. No. 4,035,047 and assigned to the assignee of the present invention. Such connectors as shown in the above referenced patents are of the metal to metal type, as opposed to a card edge connector and further include an upper contacting portion capable of withstanding and transmitting the forces required for press fitting contacts. Problems with such techniques arise whenever it is desired to form card edge connector contacts having a bellows-type interconnecting portion, a press fittable intermediate section and a removable insulator.

The advantages of the bellows-type contact may be illustrated in U.S. Pat. No. 4,094,573 assigned to the assignee of the present invention. It may be seen that the upper bellows mating portion does not permit the transfer of an axial loading force for a press-fit engagement. Moreover, such connector configurations generally incorporate sophisticated securing, or latching means to hold the contact within the insulator. Such latching means do not lend themselves to the various aspects of press fitting and repairability discussed above. In particular, the prior art bellows contact does not present a configuration heretofore facilitating a press fittable contact-insulator subassembly permitting transportation of the subassembly to a remote location for press fit assembly to a mounting substrate. The method and apparatus of the present invention provides such a combination by providing a "pull home" bellows contact having longitudinally disposed and laterally spaced alignment means and received within a pull-through insulative housing.

SUMMARY OF THE INVENTION

The invention relates to a connector and method of manufacture and assembly which includes moveable contacts lightly held within the sleeves of a removable connector insulator body. More particularly, a printed circuit card edge electrical connector assembly adapted for structural mounting on a substrate having contact receiving apertures. The assembly includes an insulative block having a plurality of sleeves formed therethrough with each of said sleeves including a pair of parallel, laterally spaced alignment troughs. Connector contacts are received into the sleeves of said insulative block with each of said contacts including an upper contactor region, an intermediate mounting portion and a lower tail portion. The contacts each also include laterally extending preformed spaced projections extending into sliding engagement with said alignment troughs to guide said contacts as the contacts are moved longitudinally within the sleeves to rigidly structurally mount the intermediate portions of the contacts in the contact receiving apertures in a substrate.

The invention additionally includes a method for manufacturing a printed circuit card edge connector comprising the steps of providing an insulative substrate having a plurality of contact receiving holes therein with the holes forming arrays lying along linear paths. An insulative housing is provided having a plurality of pull through sleeves each including a pair of spaced apart, parallel alignment troughs. A plurality of contacts are provided with each contact having a pair of laterally extending, preformed projections adapted for engagement with the alignment troughs in said insulative housing. The contacts each include intermediate press fit mounting regions and are connected to a common support strip. A plurality of contacts interconnected by a common support strip are inserted into the top openings of the sleeves to position the laterally extending projections in the insulative housing alignment troughs and the contact tails extending out the bottom openings of the sleeves. The common support strip is removed and the contact tails are inserted through the contact receiving apertures in the insulative substrate. Finally, a longitudinal force is applied to the tails of the contacts to press fit, and thereby rigidly mount the contacts into the apertures in the substrate.

In addition, the invention includes a printed circuit card edge electrical connector comprising an insulative substrate having contact receiving holes therein with holes forming arrays lying along linear paths. The connector also includes an insulative housing having a plurality of sleeves formed therethrough with the sleeves being spaced for axial alignment with the apertures in the substrate and each sleeve including a pair of parallel, laterally spaced alignment troughs. Connector contacts are received into the sleeves of the insulative housing with each of the contacts including an upper contactor region, an intermediate mounting portion, a lower tail portion and laterally extending, preformed, spaced projections extending into sliding engagement with the alignment troughs of the insulator. The contact intermediate portions are rigidly mounted into the contact receiving holes in said substrate and the insulative housing is removable by applying an upward force thereto to slide the lateral projections along the alignment troughs.

BRIEF DESCRIPTION OF THE DRAWINGS

For a more complete understanding of the present invention and for further objects and advantages thereof reference may now be had to the following description taken in conjunction with the accompanying drawings in which.

DETAILED DESCRIPTION OF THE DRAWINGS

Figure 1:
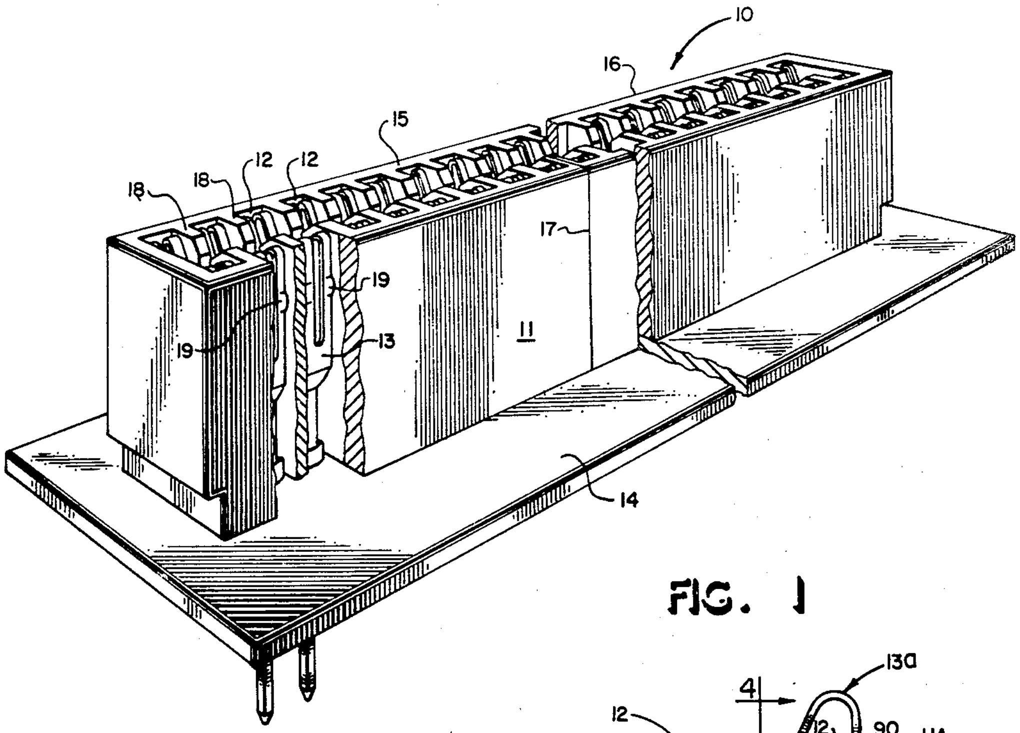
FIG. 1 is a perspective view of a modular pull-fit electrical card edge connector constructed in accordance with the principles of the present invention with a part of the insulative housing cut away to illustrate the mating engagement between contacts and sleeves in the insulator.

Referring first to FIG. 1, there is shown a perspective view of one embodiment of an electrical card edge connector 10 constructed in accordance with the principles of the present invention. The connector 10 includes an insulator 11 having a plurality of contact receiving sleeves 12 formed therethrough and contacts 13 positioned within the sleeves. Each of the contacts is rigidly mounted into one of a plurality of aligned apertures formed through a mounting substrate 14, comprising a material such as printed circuit board material known as G-10 or FR-4. The specific configuration of one embodiment of a contact 13 comprises a bellows type upper connecting portion shown most clearly in FIG. 2, as discussed in more detail below. The insulator 11 illustrates a modular connector construction. That is, the insulator 11 is actually comprised of two halves of an insulator 15 and 16 along a parting line 17. Thus, a card edge connector of any selected length may be made by piecing together segments of insulator modules in accordance with the teachings of the present invention. A mating configuration between the contacts and the insulator modules of the present invention permits an advantageous relationship whereby the contacts may be rigidly mounted into the substrate 14 by pull fitting the assembled contacts, and insulator, then the modular insulator portions may then be selectively removed by lifting them from around the contacts. Such insulator removal enables contact repairability. Thus, the connector of the present invention embodies a bellows-type contact portion in combination with a removable card edge modular insulator facilitating repair or replacement of the contacts. Each of the sleeves 12 comprise a groove extending through the connector defined by a pair of opposed parallel side walls 18. The upper portion of the particular contact 13 shown herein includes a pair of transversely extending projections, or ears 19 which engage troughs formed in portions of the divider walls 18 and may be designed to provide a light frictional engagement to hold the contact in position within the insulator 11.

Figure 2:
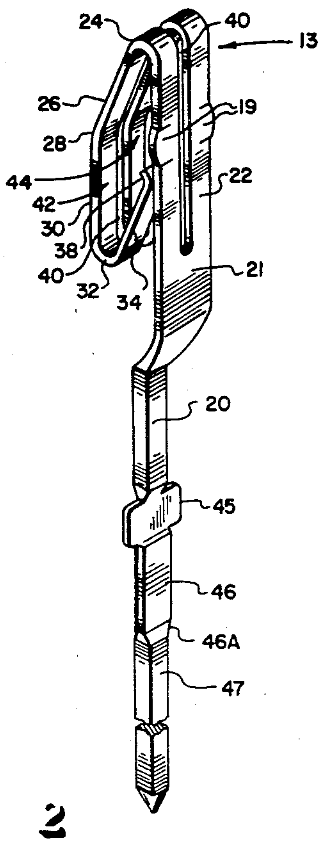
FIG. 2 is an enlarged perspective view of a pull-fit bellows type contact utilized in conjunction with the connector of the present invention.

Referring now to FIG. 2, there is shown a bellows-type contact 13 having a central shank portion 20 generally formed from square wire type stock. The other portions of the contact 13 are formed by transversely coining, or upsetting the square wire stock in order to form enlarged flattened regions on both the upper and lower extremities of a contact. A relatively flat portion 21 extends upwardly from a portion 20 and includes sequentially a first relatively straight portion 22, a curved portion 24, a second relatively straight portion 26 extending downwardly and outwardly from portion 22, a second curved portion 28, a third relatively straight portion 30 extending substantially downwardly, a third curved portion 32, an upwardly and inwardly directed relatively straight portion 34 disposed substantially parallel to a portion 26, a curved portion 36 and a terminating end portion 38 disposed substantially parallel to portion 22. The portions 22 and 38 may or may not be touching each other though the contact is in a non-engaging configuration. As illustrated in FIG. 2, a slot 40 extends along a length of a flat portion 22 from a location near the portion 21 through portion 34. Slot 40 forms a pair of resilient arms 42 and 44 which form a somewhat eliptically-shaped toroid forming a bifurcated bellows loop contact head for establishing electrical contact with its contact terminals on a printed circuit module card.

Extending beneath the shank portion 20 of contact 13 is a pair of transversely extending projections, or lower ears 45 overlying a somewhat less transversely flared press fit region 46 below which extends a relatively square contact tail 47. Straight portion 22 of contact 13 preferably includes a pair of transversely extending ears 19 formed in the upsetting process during the formation of the contact 13. The transversely extending ears 45, preferably extend into engagement with the side walls 18 of the sleeves formed through the insulator 11 to permit both a frictional retention force and lateral alignment of the contact 13. It may be seen that the lower ear 45 may frictionally engage the insulator 11 and produce sufficient retention and alignment without the provision of upper ears 19. However, in this particular embodiment upper ears 19 will be referred to in conjunction with lower ears 45 as will be discussed in more detail below. By properly configuring the width of the transverse extent of the upper ears 19 and/or the lower ears 45, generally by further upsetting the degree of interference between the insulator sleeves and the contacts may be optimally varied. Likewise, the slidable alignment of the contact is maintained by the position of coined section 45 realtive to the upper portion of the contact 13 and the insulator 11 to greatly expand the versatility of the assembly and facilitate pull home exactitude.

Figure 3:
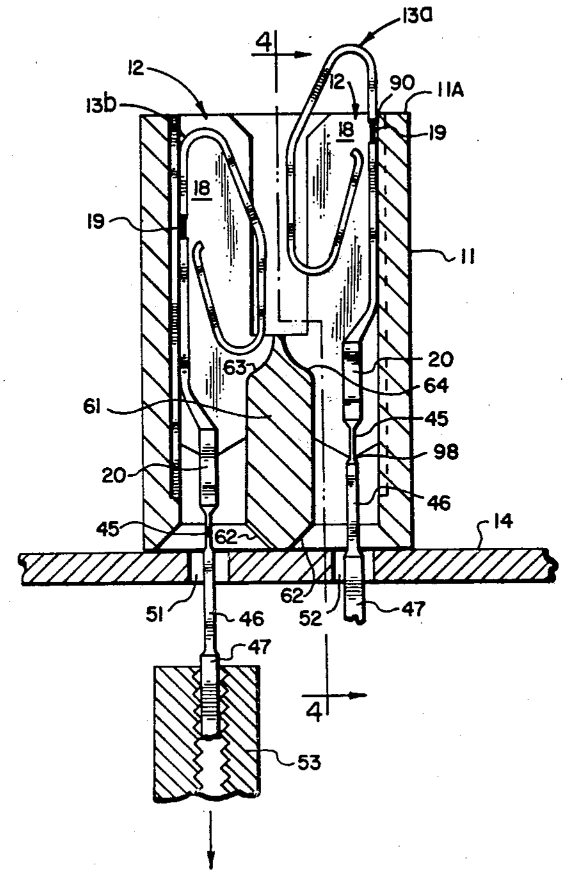
FIG. 3 is an enlarged transverse cross section view of the connector of FIG. 1 illustrating the right hand contact in position for loading in the insulator and the left hand contact in position after having been pulled home both within the substrate and the insulator.

Referring now to FIG. 3, there is shown a cross sectional view of the connector 10, including the insulator 11, the mounting substrate 14 and a pair of rows of aligned holes 51 and 52 extending through the substrate 14. It should be understood that there are additional holes 51 and 52 in the two aligned rows 51 and 52 which extend into the plane of the drawing and are not shown. Similarly, there are two rows of contacts in alignment with contacts 13*a* and 13*b* which rows also extend into the plane of the drawing of FIG. 3. FIG. 3 illustrates a manner in which a row of contacts 13*a* and 13*b* are inserted into the tops of the sleeves 12 of the insulator 11 and are lightly held in position by engagement of the transversely extending ears 19 with the side walls 18 of the sleeves 12. After contacts have been inserted into the insulator, the insulator is placed down upon the substrate 14 and the depending contact tails 47 are passed freely through the matingly aligned apertures 51. Once in position, a tool mechanically represented herein as element 53 grips the entire row or rows of depending contact tails 47 to pull fit them into position in the substrate 14. This "pull fitting" involves pulling the transversely upset portion 46 down into interfering engagement with the slightly smaller apertures 51 to rigidly mount the contacts in the apertures in the substrate and at the same time pull the contacts into proper and desired position within the insulator sleeves 12. Both rows of contacts 13*a* and 13*b* are preferably pulled home simultaneously although only one row of contacts 13*b* is illustrated in this particular figure for purposes of clarity. The operation of loading and pull home as it relates to the present invention will be explained in more detail below.

Figure 5:
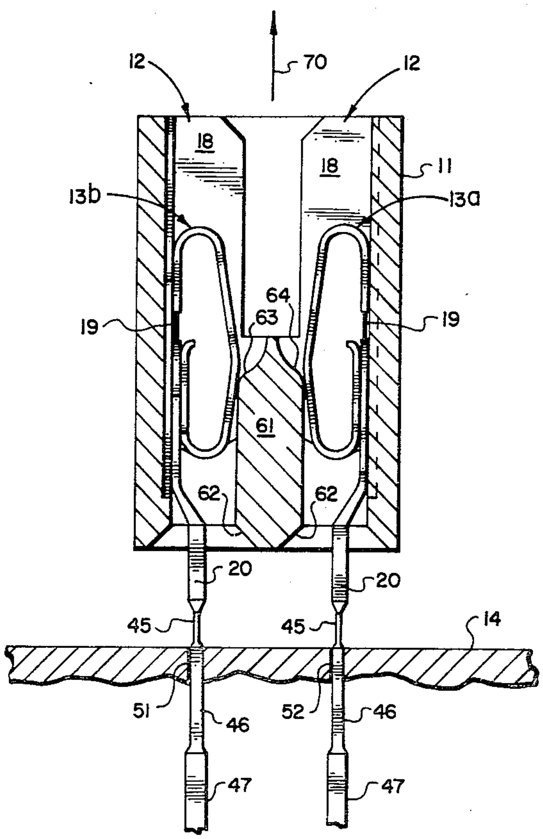
FIG. 5 is a cross section view of a connector constructed in accordance with the principles of the present invention having the contacts rigidly press fitted and mounted into a substrate and the insulator in the process of being removed from around the contacts.

As is shown in FIGS. 3 and 5, the insulator 11 includes a center bar 61 which divides the lower portions of opposed sleeves 12. It may be seen that the lower region of center bar 61 is formed with inwardly flared edge portions 62 which facilitate the replacement of an insulator around two opposed rows of contacts following its removal by guiding the insulator. The upper portion of the center bar 61 is formed of a pair of rounded corner portions 63 and 64 which similarly facilitate the removal of an insulator from around opposed pairs of row of contacts by merely lifting upwardly upon the insulator 11 such that the rounded portion 63 and 64 guide the bellowed sections passed the center bar 61 during insulator removal operation.

Figure 4:
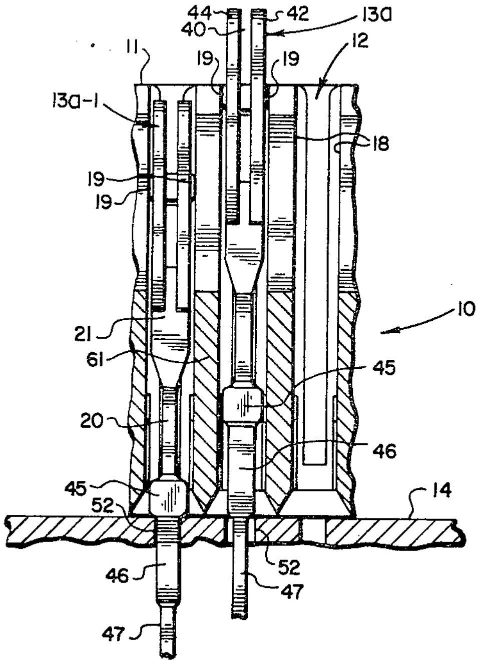
FIG. 4 is a cut-away longitudinal cross sectional view of the inside, side wall of a connector constructed in accordance with the principles of the present invention illustrating the positioning of the contacts within the sleeves of the insulator.

Referring now to FIG. 4, there is shown a vertical cross section view of an insulator of one side of insulator 11 taken about the lines 4—4 of FIG. 3. In this view it can be seen how seated contact 13*a* is initially positioned within the sleeve such that the transversely extending ears 19—19 engage the sides of the surface 18 forming the sleeves 12. Thus, the contacts are held within the insulator body 11 prior to the installation of those contacts into the substrate 14. FIG. 4 further illustrates the manner in which a seated contact 13*a*-1 is pulled home with the longitudinally spaced and laterally disposed coined sections 19 and 45 aligning and slidably securing the contact in the insulator. Once "pulled home" to a press fit the press fit section 46 firmly engages the side walls of the holes 52 providing a firm and rigid mounting of the contact 13*a*-1 within the substrate 14.

Figure 7:
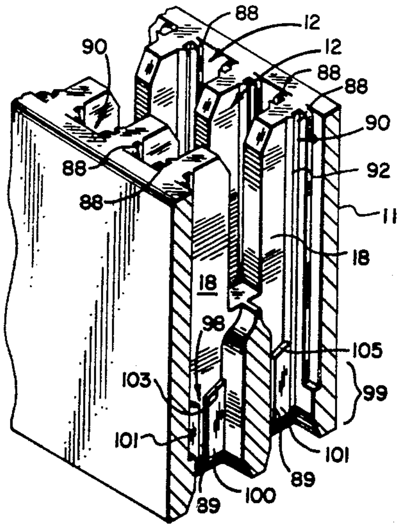
FIG. 7 is a perspective view of a transversely cross sectional insulator showing the construction of the interior sleeves.

Referring now to FIG. 7, there is shown an enlarged cut-away perspective view of the insulator 11. A sleeve 12 is shown to be constructed with pairs of opposed, longitudinal outer troughs 88 comprising an upper and outer alignment track 90 for receiving a contact 13. Each trough 88 is defined by a longitudinal shoulder 92 formed adjacent a side wall portion 18 and spaced from and parallel to back wall portions 95. Opposed shoulders 92—92 can also be seen in FIG. 8 to define outer track 90 which is adapted to receive the coined area 19 of the contact 13, therein providing the above described frictional retention and lateral alignment in conjunction with lower ear portion 45. A lower and inner alignment track 98 is comprised of a pair of lower and inner alignment troughs 89, only one of each pair being shown in FIG. 7 since the outer trough of each pair has been cut away in this view. Each inner trough 89 is spaced laterally from and parallel to an outer trough 88. The outer tracks 90 are each comprised of a pair of outer troughs 88 while the inner tracks 98 are each comprised of a pair of inner troughs 89. Inner track 98 may thus be seen to be provided in the lower region of the sleeve 12 to receive the ears 45 of the contact 13 for alignment thereof relative to the coined area 19 of said contact. Each inner trough 89 is defined by bulkheads 100 and 101 which extend parallel and adjacent to the lower portions of outer track 90. In this manner, the contact 13 received therein may be continually guided and lightly "retained" in outer track 90 as it is "pulled through" the sleeve 12, after it is first dropped into position. The inner track 98 is preferably disposed only in the lower portion of the sleeve 12 to alleviate the necessity of inserting the ears 45 into said track immediately from the top of the insulator body 11. In this manner the contacts can be dropped into an initial position within the insulator body 11 and then aligned in the tracks 90 and 98 at substantially the same time. The upper ends 103 and 105 of the bulkheads 100 and 101, respectively, are thus tapered to facilitate aligned entry of the ears 45 during top loading of the contact 13.

Figure 10:
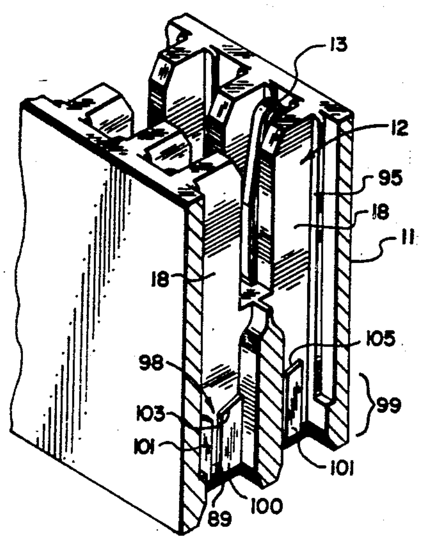
FIG. 10 is a cut-away perspective of an alternative embodiment of an insulator receiving the contact of FIG. 9 and not having an outer alignment trough.
Figure 9:
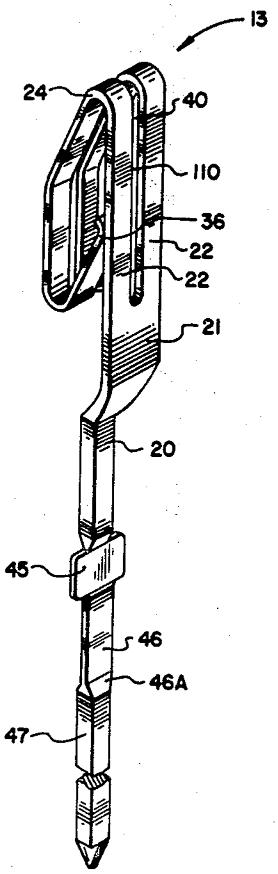
FIG. 9 is a perspective view of an alternative embodiment of a bellows type contact formed without upper alignment ears.

Referring now to FIGS. 9 and 10, there is shown an alternative embodiment of the connector of the invention illustrating a contact 13 constructed without upper ears 19. The sleeve 12 of the insulator 11 (shown best in FIG. 10) is constructed without outer track 90 and thus outer troughs 88 are eliminated. The contacts 13 of FIG. 9 are shown in FIG. 10 positioned in the sleeves 12 which are not cutaway. Lower, inner track 98 is shown to be constructed as previously defined. Frictional engagement between the contact 13 and insulator 11 is thus effected by lower ears 45 and said inner track 98. Axial alignment of the contact 13 in the sleeve 12 is effected by inner track 98 and engagement of the back side 110 of the flat, straight portion 22 of said contact with the back wall 95 of the sleeve 12. It may thus be seen that the sliding alignment of the contact 13 in the insulator 11 is made possible in this embodiment by the inner track 98 in conjunction with the longitudinally disposed regions of engagement between said contact and the wall of the insulator sleeve 12. It may also be seen that the laterally spaced troughs 88 of outer track 90 thus comprise optional contact guide means in and of themselves. Both tracks 90 and 98 are otherwise shown and described herein for purposes of specificity in the multi-track embodiment.

Figure 8:
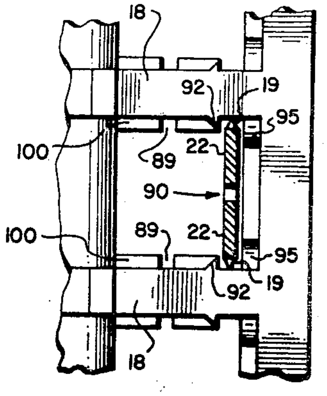
FIG. 8 is a fragmentary top view of an insulator having a contact, the lower and bowed portions of which are cut away for clarity, positioned in a sleeve thereof

Referring now to FIG. 8, there is shown a cut-away top view of the connector of the invention illustrating the manner in which the ears 19 and/or 45 on the contacts 13 engage the walls 18 of the sleeves 12 to provide alignment and a light frictional engagement between the contacts and the side walls of the insulator. The contact portions 22—22 are positioned and slidably retained within the inner and outer tracks 90 and 98 adjacent opposed shoulders 92 and back wall portions 95. This configuration allows the insulator to be used as a holding fixture for contacts prior to the installation of the contacts into a rigid mounting in the substrate. Likewise the slidably aligned, lightly retained contacts are restrained within the respective track(s) which facilitates pull home assembly without regard to modular sections. Were the contacts not slidably retained and adapted for pull through assembly only modules of contacts could be "pulled home" at a time. For example, if the contacts were fixed in the insulator, all of the contacts would have to be pulled out one time to prevent "canting" of the insulator-contact assembly from the "pulled" end. The present contact insulator assembly permits versatility and repairability in that the insulator may also be "laid over" the contacts as will be discussed below.

Figure 6:
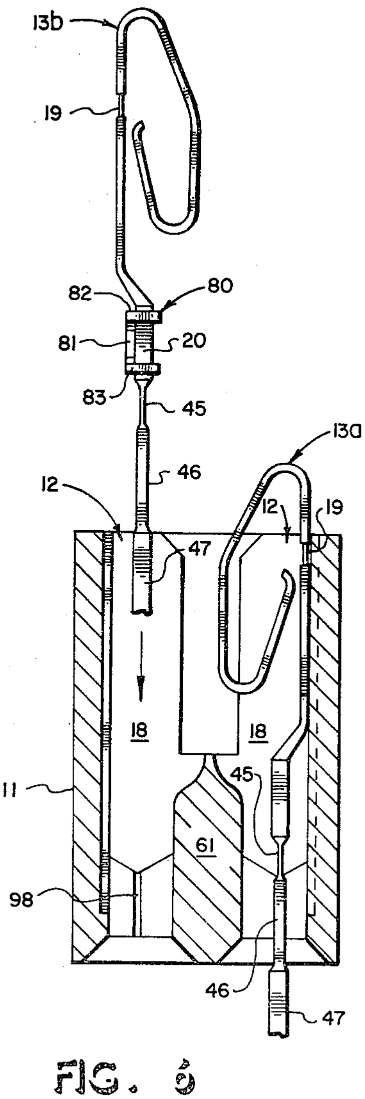
FIG. 6 shows a cross sectional view of the connector constructed in accordance with the invention having one row of contacts installed loosely within the insulator and a second row of contacts, all attached to a common bandolier strip to be simultaneously installed into the insulator.

Referring to FIG. 5, there is shown a cross sectional end view of an assembled connector constructed in accordance with the principles of the present invention wherein the two rows of contacts 13*a* and 13*b* are rigidly mounted into the substrate 14 by means of press fit sections 46 of the contacts having been pull fitted into aligned rows of apertures 51 and 52. It can be seen therein how applying force to the insulator 11 in the direction of the arrow 70 will permit the insulator 11 to be removed. The principle interfering engagement between the contacts 13*a* and 13*b* and the insulator is preferably that between the transversely extending ears 45 and the opposing walls 18 between the sleeves 12. When a force is applied to the insulator 11 in the direction of the arrow 70, the rounded portion 63 and 64 of the center barrier 61 guide the lower portions of the bellows contact portions to slide past so that the insulator can be removed to expose the two opposed rows of free standing contacts 13*a* and 13*b*. As may also be seen from FIG. 6, the bottom edges 62 of the center barrier 61 permit the insulator 11 to be easily and readily replaced upon the two opposed rows of contacts following repair thereof.

Referring back again to FIG. 6 there is shown an insulator 11 and two rows of contacts 13*a* and 13*b* being placed into the receiving sleeves 12 of the insulator 11. Each of the contacts comprising the row of contacts behind contact 13*b* is preferably mounted upon a bandolier 80 comprising a central longitudinal strip 81 having a plurality of tines 82 and 83 which grip the contact portions 20. Thus, it can be seen how all of the contacts in a row of a given module of the insulator 11 may be installed simultaneously by placing them down into the open top ends of the sleeves 12 then stripping away the bandolier and allowing the contacts to seat into the sleeves 12. The contacts 13 are held in the sleeves 12 by means of engagement of the transversely extending ears 19 with the opposed walls 18.

Referring to FIGS. 3 and 7, contact 13*a* is shown seated within the sleeve 12 a sufficient distance for the mating engagement of ears 19 with outer track 90 and/or ears 45 with inner track 98. The contact 13*a* is thus laterally aligned and retained in its longitudinal position. This feature is preferably utilized in the following assembly steps. The top of a contact 13 in the area of curved portion 24 is pressed to drive the contact into the sleeve 12 until portion 24 is flush with the top 11*a* of the insulator 11. This flush seating is effected by a relatively light push in force of a magnitude sufficient only to overcome the friction of the ears 45 against wall 18. The bellows shaped arms 42 and 44 are constructed to withstand such light axial loading although it will not support the magnitude of axial loading necessary for press fit engagement. For this reason the contacts are pulled home from this subassembly configuration. It should be noted that the subassembly above described comprises a transportable connector assembly which may be shipped to a remote location for attachment to a mounting substrate. Once the connector assembly is positioned relative to a substrate 14, the aligned contact tails 47 are dropped into the apertures 51 and 52 to a depth defined by the base portions 46*a* (FIG. 2) of the press fit shanks 46 of the contacts which base portions are brought to rest upon the substrate 14. The insulator 11 is thereby seated against the substrate 14 which effectively vertically aligns each contact 13 within the sleeves 12 relative to one another. A contact 13 which may have been pushed out of position within the insulator while the assembly is in transit is thusly "reset" for pull home engagement. The slidable contacts 13 are now pulled home within the apertures 51 and 52 by moving said contacts relative to the insulator 11 and substrate 14.

The "pull through" feature of the present invention, as illustrated in FIG. 5 permits the above described disassembly and reassembly of the connector in order to facilitate repairability of the connector contacts in a manner generally only found in "bottom loaded" contact-insulator subassemblies. Such prior art configurations most often do not permit removal of the contact upwardly through the sleeve 12 as does the present invention. However, prior to the application of "pull fit" technology press fitting had to be effected by the application of a longitudinal push-in force from the top requiring a press fit shoulder on the contact. The contact-insulator configuration of the present invention thus incorporates the advantages of press fit interengagement and a "discrete" type subassembly of the utilization of pull through contacts and self aligning receiving sleeves.

Having described the invention in connection with certain specific embodiments thereof it is to be understood that further modifications may now suggest themselves to those skilled in the art, and is intended to cover such modifications as followed in the scope of the appended claims.

We claim:

1. A method for manufacturing a printed circuit card edge connector comprising the steps of:

providing an insulative substrate having a plurality contact receiving holes therein, said holes forming arrays lying along linear paths;

providing an insulative block having a plurality of pull through sleeves each including a pair of parallel, laterally spaced alignment troughs comprising an alignment track;

providing a plurality of contacts each having an upper contactor region, an intermediate mounting portion, a lower tail portion, and a pair of laterally extending projections adapted for engagement with and being received into the alignment troughs in said insulative block, said contacts each including intermediate press fit mounting regions and being connected to a common support strip;

inserting a plurality of contacts interconnected by a common support strip into the top openings of said sleeves;

positioning said laterally extending projections of said contacts in said insulative housing alignment troughs with said contact tails extending out the bottom openings of said sleeves in axial alignment relative one to the other;

removing the common support strip;

inserting the contact tails through the contact receiving apertures in the insulative substrate; and applying a longitudinal force to the tails of the contacts to press fit, and thereby rigidly mount, the contacts into the apertures in the substrate.

2. A method for manufacturing as set forth in claim 1 wherein the step of providing a contact with laterally extending projections includes the step of forming a first pair of transversely extending ears as an integral portion of said upper contactor region and the step of forming a second pair of transversely extending ears as an integral part of said intermediate mounting region of said contact.

3. A method for manufacturing as set forth in claim 2 wherein the step of providing parallel, laterally spaced alignment troughs includes forming two pair of alignment tracks, laterally disposed one from the other in parallel spaced relationship for receiving said first and second transversely extending ears of said contacts.

4. A method for manufacturing as set forth in claim 3 wherein the step of forming two pair of alignment tracks includes forming four alignment troughs each parallel to the other in spaced relationship thereto and opposing pairs of which being adapted to receive pairs of said transversely extending ears.

5. A method for manufacturing as set forth in claim 3 wherein said pair of alignment tracks include an outer and an inner alignment track, and said step of positioning said projections of said contacts includes the step of inserting said first pair of transversely extending ears into said outer alignment track and inserting said secod pair of transversely extending ears in said inner alignment track.

6. A method for manufacturing as set forth in claim 5 wherein said outer alignment track extends through said sleeve substantially from the top to the bottom of said insulative block and said step of applying a longitudinal force to the tails of the contacts includes passing said first pair of transversely extending ears along said outer alignment track.

7. A method for manufacturing as set forth in claim 5 wherein said step of inserting said second pair of transversely extending ears into said inner alignment track includes the step of receiving said ears in said alignment track an interference engagement therewith for retaining said contacts within said insulative block.

8. A method for manufacturing as set forth in claim 1 wherein said step of positioning said laterally extending projections of said contacts in said troughs includes the steps of sliding said projections in interference engagement with said troughs and retaining said contacts within said insulative block in axial alignment.

9. A method for manufacturing as set forth in claim 8 wherein said contact projections comprise transverse ears formed on said intermediate mounting portion of said contact and said step of retaining said contacts within said insulative block in axial alignment includes the step of slidably positioning said upper contactor region relative to said sleeves and slidably receiving said transverse ears of said contacts in said troughs.

* * * * *